(12) United States Patent
Heo et al.

(10) Patent No.: US 12,588,219 B2
(45) Date of Patent: Mar. 24, 2026

(54) METAL-DOPED SWITCHING DEVICE AND SEMICONDUCTOR DEVICE INCLUDING THE SAME

(71) Applicant: Samsung Electronics Co., Ltd., Suwon-si (KR)

(72) Inventors: Sung Heo, Suwon-si (KR); Hajun Sung, Suwon-si (KR); Seongyong Park, Suwon-si (KR); Wooyoung Yang, Suwon-si (KR); Dongjin Yun, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 292 days.

(21) Appl. No.: 18/187,151

(22) Filed: Mar. 21, 2023

(65) Prior Publication Data

US 2024/0147735 A1 May 2, 2024

(30) Foreign Application Priority Data

Oct. 28, 2022 (KR) ........................ 10-2022-0141764

(51) Int. Cl.
 *H10B 63/00* (2023.01)
 *H10B 61/00* (2023.01)
(52) U.S. Cl.
 CPC ............. *H10B 63/24* (2023.02); *H10B 61/10* (2023.02)
(58) Field of Classification Search
 CPC ........ H10B 63/24; H10B 61/10; H10B 63/10; H10B 63/80; H10N 70/841; H10N 70/826; H10N 70/231; H10N 70/882
 See application file for complete search history.

(56) References Cited

U.S. PATENT DOCUMENTS

| | | | |
|---|---|---|---|
| 9,716,226 B2 | 7/2017 | Gealy et al. | |
| 10,388,867 B2 * | 8/2019 | Wu ..................... | H10N 70/8828 |
| 11,223,012 B2 | 1/2022 | Park et al. | |
| 11,659,778 B2 * | 5/2023 | Zheng .................... | C23C 14/34 257/4 |
| 2014/0008602 A1 | 1/2014 | Karpov et al. | |
| 2016/0284994 A1 * | 9/2016 | Soncini ............... | H10N 70/884 |
| 2017/0244026 A1 * | 8/2017 | Wu ......................... | H10N 70/20 |
| 2017/0346004 A1 | 11/2017 | Chang et al. | |

(Continued)

FOREIGN PATENT DOCUMENTS

| | | |
|---|---|---|
| CN | 112840459 A | 5/2021 |
| JP | 6307157 B2 | 4/2018 |

(Continued)

OTHER PUBLICATIONS

Korean Office Action dated Jan. 16, 2026 in Korean Patent Application No. 10-2022-0141764.

*Primary Examiner* — Allison Bernstein
(74) *Attorney, Agent, or Firm* — Harness, Dickey & Pierce, P.L.C.

(57) ABSTRACT

A switching device including a first electrode layer, a second electrode layer arranged to face the first electrode layer, and a selection layer arranged between the first electrode layer and the second electrode layer, wherein the first electrode layer is doped with at least one of manganese (Mn), iron (Fe), niobium (Nb), molybdenum (Mo), technetium (Tc), ruthenium (Ru), rhodium (Rh), hafnium (Hf), tantalum (Ta), tungsten (W), rhenium (Re), iridium (Ir), or platinum (Pt), may be provided.

18 Claims, 5 Drawing Sheets

(56)　　　　　　　References Cited

U.S. PATENT DOCUMENTS

| | | |
|---|---|---|
| 2022/0085104 A1 | 3/2022 | Park |
| 2022/0140003 A1 | 5/2022 | Yang et al. |

FOREIGN PATENT DOCUMENTS

| | | |
|---|---|---|
| KR | 10-2017-0100224 A | 9/2017 |
| KR | 10-2030341 B1 | 10/2019 |
| KR | 10-2130219 B1 | 5/2020 |
| KR | 10-2020-0073716 A | 6/2020 |
| KR | 10-2022-0059879 A | 5/2022 |

* cited by examiner

FIG. 3

| 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|
| Li<br>-0.42 | Be<br>-0.37 | | | | | | | | | | | B<br>-0.75 | C<br>-0.97 | N<br>-0.63 | O<br>-0.86 | F<br>-1.53 |
| Na<br>-0.45 | Mg<br>-0.28 | | | | | | | | | | | Al<br>-0.18 | Si<br>-0.49 | P<br>-0.63 | S<br>-0.72 | Cl<br>-1.05 |
| K<br>-0.76 | Ca<br>-0.3 | Sc<br>-0.13 | Ti<br>0 | V<br>-0.03 | Cr<br>-0.08 | Mn<br>0 | Fe<br>0.01 | Co<br>-0.1 | Ni<br>-0.24 | Cu<br>-0.22 | Zn<br>-0.49 | Ga<br>-0.44 | Ge<br>-0.75 | As<br>-1.16 | Se<br>-0.71 | Br<br>-0.91 |
| Rb<br>-0.85 | Sr<br>-0.54 | Y<br>-0.37 | Zr<br>-0.08 | Nb<br>0.02 | Mo<br>0.13 | Tc<br>0.23 | Ru<br>0.27 | Rh<br>0.13 | Pd<br>-0.2 | Ag<br>-0.23 | Cd<br>-0.5 | In<br>-0.39 | Sn<br>-0.53 | Sb<br>-0.98 | Te<br>-1.28 | I<br>-0.98 |
| Cs<br>-1.16 | Ba<br>-1 | La<br>-0.82 | Hf<br>0.02 | Ta<br>0.18 | W<br>0.37 | Re<br>0.45 | Os<br>X | Ir<br>0.37 | Pt<br>0 | Au<br>-0.15 | Hg<br>-0.58 | Tl<br>-0.6 | Pb<br>-0.85 | Bi<br>-1.23 | Po<br>-1.1 | At<br>-0.74 |

METAL-DOPED SWITCHING DEVICE AND SEMICONDUCTOR DEVICE INCLUDING THE SAME

CROSS-REFERENCE TO RELATED APPLICATION

This application is based on and claims priority under 35 U.S.C. § 119 to Korean Patent Application No. 10-2022-0141764, filed on Oct. 28, 2022, in the Korean Intellectual Property Office, the disclosure of which is incorporated by reference herein in its entirety.

BACKGROUND

1. Field

The disclosure relates to metal-doped switching devices and/or semiconductor devices including the same.

2. Description of the Related Art

Recently, in line with the trend of the compact size and high performance of electronic devices, memory devices that are capable of storing information in various electronic devices such as computers and portable communication devices, etc. are required. Examples of the memory devices include phase-change random access memory (PRAM), resistive random memory (RRAM), magnetic random access memory (MRAM), and the like, which store data by using the characteristic that switching between different resistance states is conducted according to a voltage or current applied thereto. These memory devices may include ovonic threshold switch (OTS)-based switching device, in which a chalcogenide material is used. In the chalcogenide material used in a switching device, coupling between components constituting the material is unstable, and thus, when switching is repeated, the threshold voltage may decrease.

SUMMARY

According to an example embodiment, a switching device, in which a decrease in a threshold voltage due to switching is reduced, may be provided.

According to an example embodiment, a semiconductor device including a switching device, in which a decrease in a threshold voltage due to switching is reduced, may be provided.

Additional aspects will be set forth in part in the description which follows and, in part, will be apparent from the description, or may be learned by practice of the presented example embodiments of the disclosure.

According to an aspect of the disclosure, a switching device may include a first electrode layer, a second electrode layer arranged to face the first electrode layer, and a selection layer arranged between the first electrode layer and the second electrode layer, wherein the first electrode layer is doped with at least one of manganese (Mn), iron (Fe), niobium (Nb), molybdenum (Mo), technetium (Tc), ruthenium (Ru), rhodium (Rh), hafnium (Hf), tantalum (Ta), tungsten (W), rhenium (Re), iridium (Ir), or platinum (Pt).

A doping concentration of the first electrode layer may be equal to or less than about 15 at %.

A doping concentration of the first electrode layer may be greater than or equal to about 6 at % and equal to or less than about 15 at %.

The first electrode layer may include titanium nitride (TiN).

The selection layer may include a chalcogenide material including germanium (Ge), arsenic (As), and selenium (Se).

The chalcogenide may show ovonic threshold switching material characteristics.

The second electrode layer may include titanium nitride (TiN).

According to another aspect of the disclosure, a memory cell may include a first electrode layer, a second electrode layer arranged to face the first electrode layer, a selection layer arranged between the first electrode layer and the second electrode layer, a third electrode layer arranged to face the first electrode layer, and a variable resistance layer arranged between the first electrode layer and the third electrode layer, wherein the first electrode layer is doped with at least one of manganese (Mn), iron (Fe), niobium (Nb), molybdenum (Mo), technetium (Tc), ruthenium (Ru), rhodium (Rh), hafnium (Hf), tantalum (Ta), tungsten (W), rhenium (Re), iridium (Ir), or platinum (Pt).

A doping concentration of the first electrode layer may be equal to or less than about 15 at %.

A doping concentration of the first electrode layer may be greater than or equal to about 6 at % and equal to or less than about 15 at %.

The first electrode layer may include titanium nitride (TiN).

The selection layer may include a chalcogenide material including germanium (Ge), arsenic (As), and selenium (Se).

The chalcogenide may show ovonic threshold switching material characteristics.

The variable resistance layer may include a phase change material.

According to another aspect of the disclosure, a semiconductor device may include a plurality of first electrode lines extending in a first direction and arranged apart from each other, a plurality of second electrode lines extending in a second direction crossing the first direction and are arranged apart from each other, and a plurality of memory cells electrically connected between the first electrode lines and the second electrode lines at intersections between the first electrode lines and the second electrode lines, the plurality of memory cells each including a first electrode layer, a selection layer, a second electrode layer, and a variable resistance layer that are electrically connected to each other, wherein the first electrode layer is doped with at least one of manganese (Mn), iron (Fe), niobium (Nb), molybdenum (Mo), technetium (Tc), ruthenium (Ru), rhodium (Rh), hafnium (Hf), tantalum (Ta), tungsten (W), rhenium (Re), iridium (Ir), or platinum (Pt).

A doping concentration of the first electrode layer may be equal to or less than about 15 at %.

A doping concentration of the first electrode layer may be greater than or equal to about 6 at % and equal to or less than about 15 at %.

The semiconductor device may further include a third electrode layer electrically connected to the variable resistance layer.

The semiconductor device may have a three-dimensional cross point array structure.

The semiconductor device may include PRAM, RRAM, or MRAM.

BRIEF DESCRIPTION OF THE DRAWINGS

The above and other aspects, features, and advantages of some example embodiments of the disclosure will be more apparent from the following description taken in conjunction with the accompanying drawings, in which:

FIG. 3 is a table showing a change in a work function of an electrode according to metal doping;

DETAILED DESCRIPTION

Figure 1:
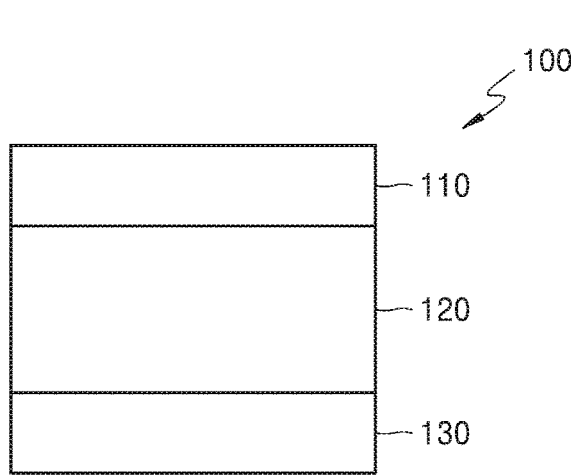
FIG. 1 is a cross-sectional view of a switching device according to an example embodiment.

Reference will now be made in detail to some example embodiments, which are illustrated in the accompanying drawings, wherein like reference numerals refer to like elements throughout. In this regard, the present example embodiments may have different forms and should not be construed as being limited to the descriptions set forth herein. Accordingly, the disclosed example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a switching device in which an electrode is doped, and a semiconductor device including the same will be described in detail with reference to the attached drawings. In the drawings, like reference numerals refer to like elements throughout and sizes of constituent elements may be exaggerated for convenience of explanation and the clarity of the specification. Some example embodiments may have different forms and should not be construed as being limited to the descriptions set forth herein.

It will also be understood that when an element is referred to as being "on" or "above" another element, the element may be in direct contact with the other element or other intervening elements may be present. The singular forms include the plural forms unless the context clearly indicates otherwise. It should be understood that, when a part "comprises" or "includes" an element, unless otherwise defined, other elements are not excluded from the part and the part may further include other elements.

The use of the terms "a" and "an" and "the" and similar referents are to be construed to cover both the singular and the plural. The steps of all methods described herein can be performed in any suitable order unless otherwise indicated herein or otherwise clearly contradicted by context, and are not limited to the described order.

Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The use of any and all examples, or exemplary language (e.g., "such as") provided herein, is intended merely to better illuminate the disclosure and does not pose a limitation on the scope of the disclosure unless otherwise claimed.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a cross-sectional view of a switching device 100 according to an example embodiment.

Referring to FIG. 1, the switching device 100 may include a first electrode layer 110, a second electrode layer 130 arranged to face the first electrode layer 110, and a selection layer 120 between the first electrode layer 110 and the second electrode layer 130. The selection layer 120 may be electrically connected between the first electrode layer 110 and the second electrode layer 130.

The first electrode layer 110 and the second electrode layer 130 may be a path through which current flows. When a voltage greater than a threshold voltage is applied between the first electrode layer 110 and the second electrode layer 130 of the switching device 100, the selection layer 120 is in a low resistance state and current starts to flow, and when a voltage less than the threshold voltage is applied between the first electrode layer 110 and the second electrode layer 130 of the switching device 100, the selection layer 120 returns to a high resistance state and current hardly flows. Also, when the current flowing through the selection layer 120 becomes less than a holding current, the selection layer 120 may change to a high resistance state. Accordingly, the switching device 100 may be turned on/off according to a voltage applied between the first electrode layer 110 and the second electrode layer 130.

The first electrode layer 110 and the second electrode layer 130 may be formed of a conductive material. For example, each conductive material may include a metal, a conductive metal oxide, a conductive metal nitride, or a combination thereof. For example, the conductive material may include at least one type selected from among carbon (C), titanium nitride (TiN), titanium silicon nitride (TiSiN), titanium carbon nitride (TiCN), titanium aluminum nitride (TiAlN), and titanium carbon silicon nitride (TiCSiN), but is not limited thereto.

The first electrode layer 110 may be doped with metal. In some example embodiments, the second electrode layer 130 also may be doped with metal. A work function of the metal doping the first electrode layer 110 or the second electrode layer 130 may be greater than work functions of conductive materials of the first electrode layer 110 and the second electrode layer 130. Examples of the metal doping the first electrode layer 110 may include manganese (Mn), iron (Fe), niobium (Nb), molybdenum (Mo), technetium (Tc), ruthenium (Ru), rhodium (Rh), hafnium (Hf), tantalum (Ta), tungsten (W), rhenium (Re), iridium (Ir), platinum (Pt), or a combination thereof. A doping concentration of the metal doping the first electrode layer 110 may be less than or equal to about 15 at %. The doping concentration of the metal doping the first electrode layer 110 may be greater than or equal to about 6 at % and less than or equal to about 15 at %. The doping concentration of the metal doping the first electrode layer 110 may be greater than or equal to about 10 at % and less than or equal to about 15 at %.

The selection layer 120 may include a chalcogenide material having ovonic threshold switch (OTS) characteristics. For example, the selection layer 120 may include a chalcogenide material including germanium (Ge), arsenic (As), and selenium (Se).

The selection layer 120 may be formed using deposition, and may be formed using, for example, physicochemical deposition. The selection layer 120 may be formed through a physical vapor deposition (PVD) process using at least one target including a chalcogenide material including germanium (Ge), arsenic (As), and selenium (Se). The at least one target may include a target including germanium (Ge), arsenic (As), and selenium (Se). The selection layer 120 may be formed by a chemical vapor deposition (CVD) process or an atomic layer deposition (ALD) by using a plurality of sources including a chalcogenide material including germanium (Ge), arsenic (As), and selenium (Se).

The selection layer 120 may be formed to a small thickness by co-sputtering deposition. For example, a thickness of the selection layer 120 may be greater than or equal to about 5 nm and less than or equal to about 50 nm, greater than or equal to about 5 nm and less than or equal to about 30 nm.

As the first electrode layer 110 is doped with a metal having a relatively great work function, a decrease in a threshold voltage due to diffusion of selenium (Se) in the selection layer 120 may be compensated for and the performance of a semiconductor device may be improved.

The switching device 100 according to an example embodiment may be applied to a memory cell and used for a switching operation of the memory cell.

Figure 2:
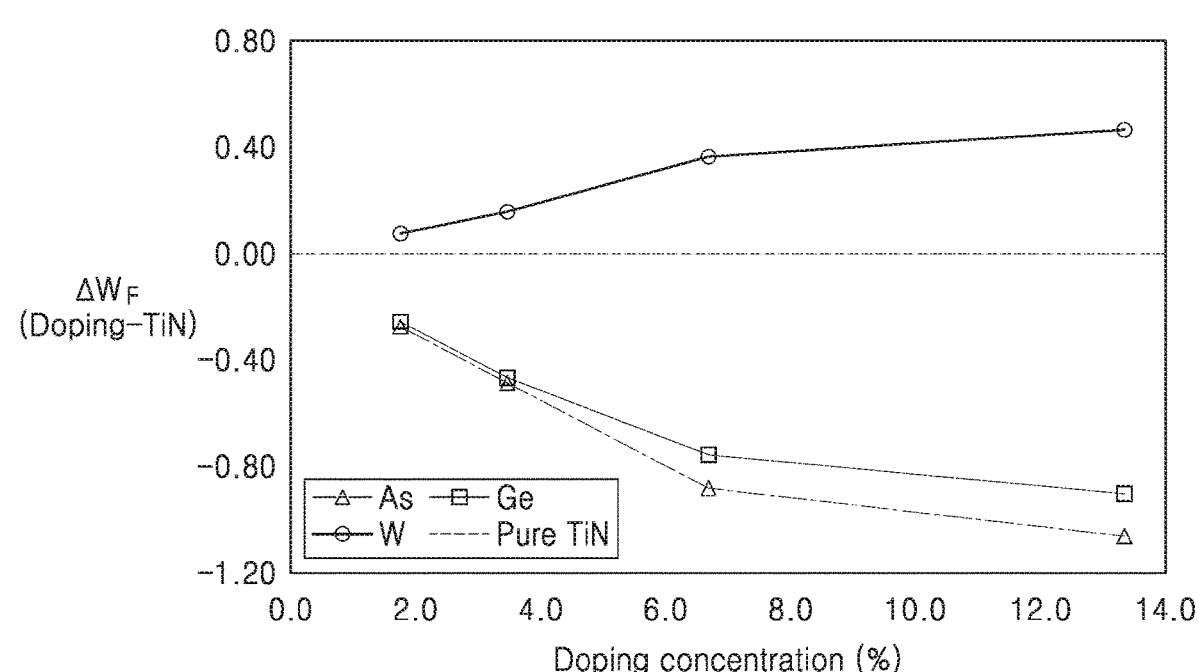
FIG. 2 is a graph showing a change in a work function of an electrode according to metal doping.

FIG. 2 is a graph showing a change in a work function of an electrode according to metal doping, and Table 1 shows a change in the work function of the electrode according to metal doping, in numerical values.

Referring to FIG. 2 and Table 1, the change in the work function of the first electrode layer 110 of FIG. 1 according to doping concentrations of tungsten (W), germanium (Ge), and arsenic (As) are shown.

TABLE 1

| Doping (at %) | As | Ge | W |
|---|---|---|---|
| 1.8 | −0.27 | −0.26 | 0.08 |
| 3.4 | −0.48 | −0.46 | 0.16 |
| 6.7 | −0.88 | −0.75 | 0.37 |
| 13.3 | −1.06 | −0.90 | 0.47 |

When the first electrode layer 110 is doped with germanium (Ge) or arsenic (As), the work function of the first electrode layer 110 decreases as the doping concentration increases.

When the first electrode layer 110 is doped with tungsten (W), the work function of the first electrode layer 110 increases as the doping concentration increases.

FIG. 3 is a table showing a change in a work function of an electrode according to metal doping.

Referring to FIG. 3, a change in a work function of the first electrode layer 110 of FIG. 1, which is doped with a metal at a doping concentration of 6 at %, is shown in the periodic table.

When the first electrode layer 110 is doped with lithium (Li), beryllium (Be), boron (B), carbon (C), nitrogen (N), oxygen (O), fluorine (F), sodium (Na), magnesium (Mg), aluminum (Al), silicon (Si), phosphorus (P), sulfur (S), chlorine (Cl), potassium (K), calcium (Ca), scandium (Sc), vanadium (V), chromium (Cr), cobalt (Co), nickel (Ni), copper (Cu), zinc (Zn), gallium (Ga), germanium (Ge), arsenic (As), selenium (Se), bromine (Br), rubidium (Rb), strontium (Sr), yttrium (Y), zirconium (Zr), palladium (Pd), silver (Ag), cadmium (Cd), indium (In), tin (Sn), antimony (Sb), tellurium (Te), iodine (I), cesium (Cs), barium (Ba), lanthanum (La), gold (Au), mercury (Hg), thallium (Tl), lead (Pb), bismuth (Bi), polonium (Po), or astatine (At), the work function of the first electrode layer 110 decreases.

When the first electrode layer 110 is doped with manganese (Mn), iron (Fe), niobium (Nb), molybdenum (Mo), technetium (Tc), ruthenium (Ru), rhodium (Rh), hafnium (Hf), tantalum (Ta), tungsten (W), rhenium (Re), iridium (Ir), or platinum (Pt), the work function of the first electrode layer 110 increases. By doping the first electrode layer 110 with a metal that increases the work function, a range of the decrease in the threshold voltage due to switching may be reduced.

Figure 4:
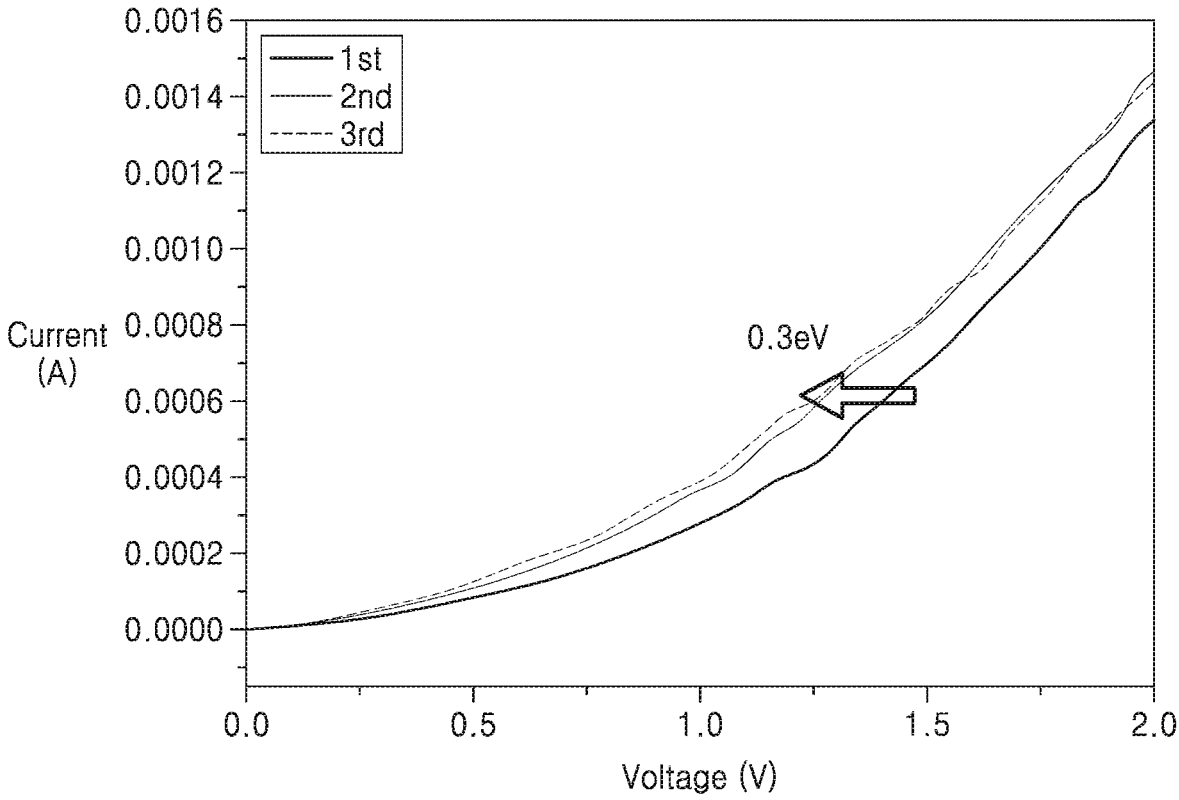
FIG. 4 is a graph showing an IV curve of a metal-doped switching device.

FIG. 4 is a graph showing an IV curve of a metal-doped switching device.

Referring to FIG. 4, an IV curve corresponding to when the first electrode layer 110 of the switching device 100 of FIG. 1 is doped with tungsten. As shown in FIG. 3, tungsten is a metal having a greater work function than that of titanium nitride (TiN).

Before doping the first electrode layer 110 with a tungsten metal, a threshold voltage value decreased by more than −1 eV on the IV curve according to the $1^{st}$, $2^{nd}$ and $3^{rd}$ switching. In FIG. 4 where a tungsten metal is doped on the first electrode layer 110, the threshold voltage value decreased by −0.3 eV on the IV curve when the $3^{rd}$ switching was performed compared to the $1^{st}$ switching. This shows that a range of the decrease in the threshold voltage may be reduced by doping the first electrode layer 110 with a metal having a relatively great work function.

Figure 5:
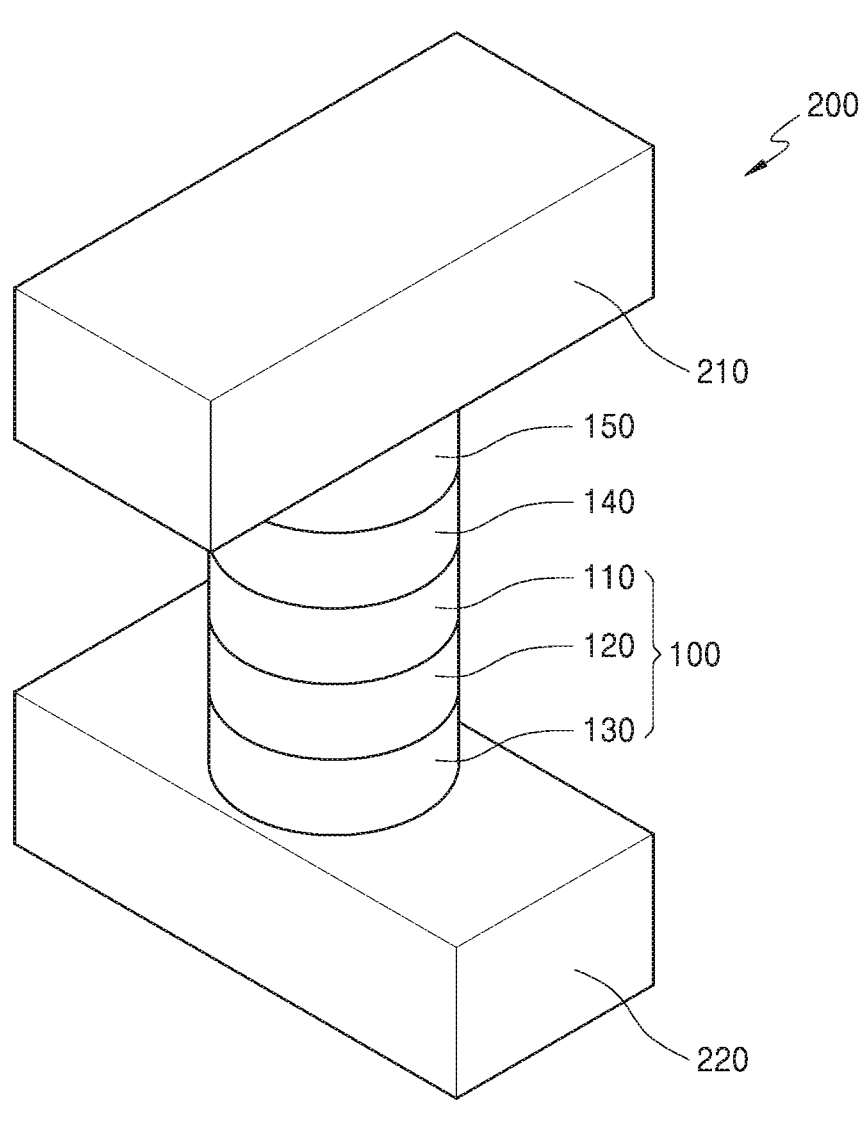
FIG. 5 is a perspective view of a memory cell according to an example embodiment.

FIG. 5 is a perspective view of a memory cell according to an example embodiment.

Referring to FIG. 5, a memory cell 200 may include the selection layer 120 and a variable resistance layer 140 that are electrically connected between a first electrode line 210 and a second electrode line 220. The memory cell 200 may include the first electrode layer 110, the second electrode layer 130 arranged to face the first electrode layer 110, and the selection layer 120 arranged between the first electrode layer 110 and the second electrode layer 130, a third electrode layer 150 arranged to face the first electrode layer 110, and the variable resistance layer 140 arranged between the first electrode layer 110 and the third electrode layer 150.

The selection layer 120 may be electrically connected between the first electrode layer 110 and the second electrode layer 130, and the variable resistance layer 140 may be electrically connected between the first electrode layer 110 and the third electrode layer 150.

In the memory cell 200 of FIG. 5, the selection layer 120 may act as a switching device, together with the first electrode layer 110 and the second electrode layer 130. The switching device 100 may be the same as the switching device 100 of FIG. 1. When a voltage greater than a threshold voltage is applied to the switching device 100, the selection layer 120 is in a low resistance state and current starts to flow, and when a voltage less than the threshold voltage is applied to the switching device 100, the selection layer 120 returns to a high resistance state and currently hardly flows. Also, when the current flowing through the selection layer 120 becomes less than a holding current, the selection layer 120 may change to a high resistance state. Accordingly, the switching device 100 may be turned on or off according to a voltage applied thereto.

The first electrode layer 110 may be doped with metal. A metal doping the first electrode layer 110 may include a metal having a relatively great work function. Examples of the metal doping the first electrode layer 110 may include manganese (Mn), iron (Fe), niobium (Nb), molybdenum (Mo), technetium (Tc), ruthenium (Ru), rhodium (Rh), hafnium (Hf), tantalum (Ta), tungsten (W), rhenium (Re), iridium (Ir), platinum (Pt), or a combination thereof. A doping concentration of the metal doping the first electrode layer 110 may be less than or equal to about 15 at %. The doping concentration of the metal doping the first electrode layer 110 may be greater than or equal to about 6 at % and less than or equal to about 15 at %. The doping concentration of the metal doping the first electrode layer 110 may be greater than or equal to about 10 at % and less than or equal to about 15 at %.

The variable resistance layer 140 may have a function of storing information. A resistance value of the variable resistance layer 140 may vary according to an applied voltage. For example, the variable resistance layer 140 may include a phase change material that reversibly changes between an amorphous state and a crystalline state according to a heating time. The phase change material may be in a high resistance state in an amorphous state and may be in a low resistance state in a crystalline state. By defining the high resistance state as '0' and the low resistance state as '1', data may be stored in the switching device.

The first electrode line 210 and the second electrode line 220 may be a path through which current flows. The first electrode line 210 and the second electrode line 220 may selectively include a conductive material. For example, each conductive material may independently include a metal, a conductive metal oxide, a conductive metal nitride, or a combination thereof. For example, the conductive material may be include at least one type from among carbon (C), titanium nitride (TiN), titanium silicon nitride (TiSiN), titanium carbon nitride (TiCN), titanium aluminum nitride (TiAlN), titanium carbon silicon nitride (TiCSiN), tantalum (Ta), tantalum nitride (TaN), tungsten (W), and tungsten nitride (WN), but is not limited thereto.

The first electrode layer 110, the second electrode layer 130, and the third electrode layer 150 may be a path through which current flows. The first electrode layer 110, the second electrode layer 130, and the third electrode layer 150 may selectively include a conductive material. For example, each conductive material may independently include a metal, a conductive metal oxide, a conductive metal nitride, or a combination thereof. For example, the conductive material may include at least one type selected from among carbon (C), titanium nitride (TiN), titanium silicon nitride (TiSiN), titanium carbon nitride (TiCN), titanium aluminum nitride (TiAlN), titanium carbon silicon nitride (TiCSiN), tantalum (Ta), tantalum nitride (TaN), tungsten (W), and tungsten nitride (WN), but is not limited thereto.

The memory cell 200 may have a pillar shape. For example, the memory cell 200 may have a cylindrical shape, or may have various column shapes such as a square column, an elliptical column, or a polygonal column.

The memory cell 200 may have a side surface that is perpendicular to a substrate. In other words, the memory cell 200 may have a constant cross-sectional area perpendicular to the stacking direction (Z-direction), but this is an example, and may also have a structure in which an upper portion thereof is broader than a lower portion thereof or the lower portion is broader than the upper portion. In addition, the selection layer 120 and the variable resistance layer 140 may each independently have the same or different upper and lower areas. These shapes may vary depending on the formation method of each component.

Figure 6:
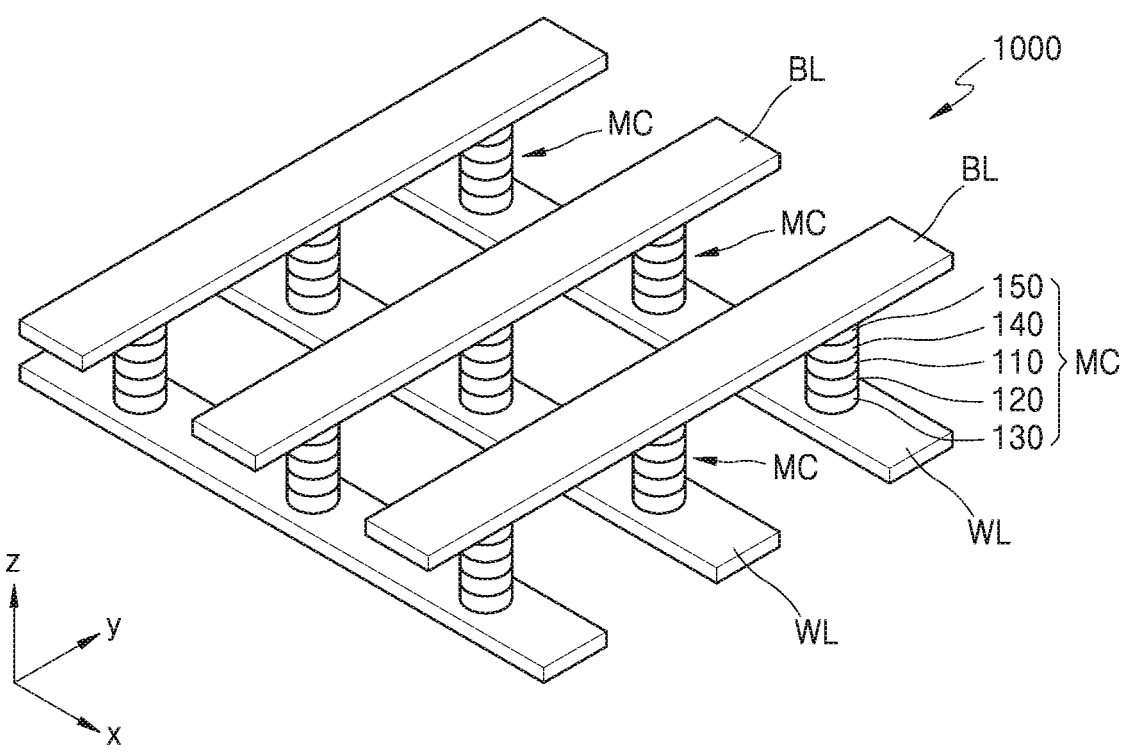
FIG. 6 is a perspective view of a semiconductor device according to an example embodiment.

FIG. 6 is a perspective view of a semiconductor device 1000 according to an embodiment.

Referring to FIG. 6, the semiconductor device 1000 may include a plurality of memory cells MC, and the memory cells MC may be the memory cell 200 of FIG. 5. The semiconductor device 1000 may have a three-dimensional cross point array structure. The semiconductor device 1000 may include first electrode lines WL and second electrode lines BL positioned on different levels. The semiconductor device 1000 may include the first electrode lines WL extending in a first direction (X-direction) and spaced apart from each other in a second direction (Y-direction) perpendicular to the first direction. In addition, the semiconductor device 1000 may include the second electrode lines BL spaced apart from the first electrode lines WL in a third direction (Z-direction) and extending parallel to each other in the second direction crossing the first direction.

The memory cells MC may be arranged between the first electrode lines WL and the second electrode lines BL. The memory cells MC may be electrically connected to the first electrode lines WL and the second electrode lines BL and may be arranged at intersections thereof. The memory cells MC may be arranged in a matrix form. The memory cells MC may each include the first electrode layer 110, the selection layer 120, the second electrode layer 130, and the variable resistance layer 140 that are electrically connected to each other. The memory cells MC may each further include the third electrode layer 150 electrically connected to the variable resistance layer 140. The selection layer 120 may be electrically connected between the first electrode layer 110 and the second electrode layer 130, and the variable resistance layer 140 may be electrically connected between the first electrode layer 110 and the third electrode layer 150. Various voltage signals or current signals may be provided through the first electrode lines WL and the second electrode lines BL, and accordingly, data may be written to or read from a selected memory cell MC, and writing or reading with respect to the remaining, non-selected memory cells MC may be prevented or mitigated.

The first electrode layer 110 may be doped with metal. A metal doping the first electrode layer 110 may include a metal having a relatively great work function. Examples of the metal doping the first electrode layer 110 may include manganese (Mn), iron (Fe), niobium (Nb), molybdenum (Mo), technetium (Tc), ruthenium (Ru), rhodium (Rh), hafnium (Hf), tantalum (Ta), tungsten (W), rhenium (Re), iridium (Ir), platinum (Pt), or a combination thereof. A doping concentration of the metal doping the first electrode layer 110 may be less than or equal to about 15 at %. The doping concentration of the metal doping the first electrode layer 110 may be greater than or equal to about 6 at % and less than or equal to about 15 at %. The doping concentration of the metal doping the first electrode layer 110 may be greater than or equal to about 10 at % and less than or equal to about 15 at %.

The variable resistance layer 140 and the selection layer 120 may be connected and arranged in series along the third direction (Z-direction), and the selection layer 120 may be electrically connected to one of the first electrode line WL and the second electrode line BL, and the variable resistance layer 140 may be electrically connected to the other electrode line. Various voltage signals or current signals may be provided through the first electrode lines WL and the second electrode lines BL, and accordingly, data may be written to or read from a selected memory cell MC, and writing or reading with respect to the remaining, non-selected memory cells MC may be prevented or mitigated.

The array of memory cells MC may have a multi-deck structure. The memory cells MC may be stacked in the third direction (Z-direction). For example, the array of memory cells MC may have a multi-deck structure in which the first electrode lines WL and the second electrode lines BL are alternately stacked along the third direction (Z-direction). Here, the memory cells MC may be located between the first electrode lines WL and the second electrode lines BL that are alternately stacked.

The memory cells MC may be arranged in a same structure along the third direction (Z-direction). For example, in the memory cell MC arranged between the first electrode line WL and the second electrode line BL, the variable resistance layer 140 may be electrically connected to the second electrode line BL, and the selection layer 120 may be electrically connected to the first electrode line WL, and the variable resistance layer 140 and the selection layer 120 may be connected in series, but the disclosure is not limited thereto. For example, unlike that shown in FIG. 7, positions of the selection layer 120 and the variable resistance layer 140 in the memory cell MC may be exchanged. For example, in the memory cell MC, the variable resistance layer 140 may be electrically connected to the first electrode line WL, and the selection layer 120 may be electrically connected to the second electrode line BL.

The selection layer 120 may have a function of selecting the corresponding semiconductor device 1000 by controlling the flow of current in the semiconductor device 1000 electrically connected to the corresponding selection layer 120. For example, the selection layer 120 may include a material having resistance that may change according to the magnitude of a voltage applied across both ends thereof. For example, the selection layer 120 may have ovonic threshold switching characteristics.

The selection layer 120 has excellent thermal stability and may be less damaged or deteriorated in a manufacturing process of a semiconductor device or the like. For example, the selection layer 120 may have a crystallization temperature of about 350° C. or higher and about 600° C. or lower. For example, the crystallization temperature may be about 380° C. or higher, about 400° C. or higher, about 580° C. or lower, or about 550° C. or lower. In addition, the selection layer 120 may have a sublimation temperature of about 250° C. or higher and about 400° C. or lower. For example, the sublimation temperature may be about 280° C. or higher, about 300° C. or higher, about 380° C. or lower, or about 350° C. or lower.

The variable resistance layer 140 may have a function of storing information. For example, a resistance value of the variable resistance layer 140 may vary according to an applied voltage. The semiconductor device 1000 may store or erase digital information such as '0' or '1' according to a resistance change in the variable resistance layer 140. For example, the semiconductor device 1000 may write data as '0' for a high resistance state of the variable resistance layer 140 and '1' for a low resistance state of the variable resistance layer 140. Here, writing from the high resistance state '0' to the low resistance state '1' may be referred to as a 'set operation', and writing from the low resistance state '1' to the high resistance state '0' may be referred to as a 'reset operation'.

The variable resistance layer 140 may be changed into one of a plurality of resistance states by an applied electric pulse. The variable resistance layer 140 may include a phase change material, the crystal state of which changes according to an amount of current. The phase change material may be changed into an amorphous state with relatively high resistance or a crystalline state with relatively low resistance. A phase of the phase change material may be reversibly changed by Joule's heat generated by a voltage applied to both ends of a memory device, and data may be stored in the semiconductor device 1000 through the phase change as above.

The phase change material may include selenium (Se) and/or tellurium (Te), and may include at least one element selected from among germanium (Ge), antimony (Sb), bismuth (Bi), lead (Pb), tin (Sn), silver (Ag), arsenic (As), sulfur (S), silicon (Si), indium (In), titanium (Ti), gallium (Ga), phosphorus (P), boron (B), oxygen (O), and carbon (C). The phase change material may include Ge—Sb—Te (GST). Ge—Sb—Te (GST) is a compound including germanium (Ge), antimony (Sb), and tellurium (Te), and may include $Ge_2Sb_2Te_5$, $Ge_2Sb_2Te_7$, $GeSb_2Te_4$, and/or $GeSb_4Te_7$.

The phase change material may further include at least one metal element selected from among aluminum (Al), zinc (Zn), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), and polonium (Po). The metal element may increase electrical conductivity and thermal conductivity of the variable resistance layer 140 and may increase the crystallization rate.

Each element constituting the phase change material may have diverse chemical stoichiometry. Depending on the chemical stoichiometry of each element, a crystallization temperature, a melting point, a phase change rate according to crystallization energy, and information retention of the phase change material may be adjusted. For example, the chemical stoichiometry may be adjusted such that a melting point of the phase change material is about 500° C. to about 800° C.

The variable resistance layer 140 may have a multilayer structure in which two or more layers having different physical properties are alternately stacked. For example, the variable resistance layer 140 may include a structure in which a layer including Ge—Te and a layer including Sb—Te are alternately stacked. This stack structure may be a super-lattice structure. In addition, a barrier layer may be further included between the plurality of layers. The barrier layer may have a function of preventing or mitigating material diffusion among the plurality of layers.

A method of driving the semiconductor device 1000 is briefly described as below. In the semiconductor device 1000, a voltage may be applied to the variable resistance layer 140 of the memory cell MC through the first electrode line WL and the second electrode line BL so that current may flow.

In addition, an arbitrary memory cell MC may be addressed by selecting the first electrode line WL and the second electrode line BL, and a certain signal may be applied between the selected first electrode line WL and the selected second electrode line, and the memory cell MC may be programmed, accordingly. Also, by measuring a current value through the second electrode line BL, information according to a resistance value of the variable resistance layer 140 of the corresponding memory cell MC, that is, programmed information, may be read.

The semiconductor device 1000 may include PRAM, RRAM, or MRAM. However, this is merely an example. In some example embodiments, the semiconductor device 1000 may include a memristor or the like.

When a material of a memory cell included in the semiconductor device 1000 includes a phase change material that reversibly changes between an amorphous state and a crystalline state, the semiconductor device 1000 may include a PRAM. A phase of the PRAM may be reversibly changed by Joule's heat generated by a voltage applied to both ends of a memory cell, and data may be stored in the memory cell through the phase change as above. For example, the phase change material may be in a high resistance state in an amorphous state and may be in a low resistance state in a crystalline state. By defining the high resistance state as '0' and the low resistance state as '1', data may be stored in the memory cell.

When a material of a memory cell included in the semiconductor device 1000 includes a transition metal oxide, the semiconductor device 1000 may include an RRAM. In a memory cell including a transition metal oxide, at least one electrical path may be formed or extinguished by a program operation. When the electrical path is formed, a memory device may have a low resistance value, and when the electrical path is extinguished, the memory cell may have a high resistance value. Data may be stored in the semiconductor device 1000 by using a difference in the resistance value of the memory cell. The transition metal oxide may include at least one type of metal selected from among tantalum (Ta), zirconium (Zr), titanium (Ti), hafnium (Hf), manganese (Mn), yttrium (Y), nickel (Ni), cobalt (Co), zinc (Zn), niobium (Nb), copper (Cu), iron (Fe), or chromium (Cr). The transition metal oxide may include at least one from among $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, and $Fe_2O_{3-x}$ ($0 \le x \le 1.5$, $0 \le y \le 0.5$).

When a memory cell included in the semiconductor device 1000 has a magnetic tunnel junction (MTJ) structure including two electrodes including a magnetic body and a dielectric arranged between the two magnetic body electrodes, the semiconductor device 1000 may include an MRAM. Each of the two electrodes may be a magnetization-pinned layer and a magnetization-free layer, and a dielectric material therebetween may be a tunnel barrier layer. The magnetization-pinned layer may have a magnetization direction fixed in one direction, and the magnetization-free layer may have a magnetization direction changeable to be parallel or antiparallel to the magnetization direction of the magnetization-pinned layer. The magnetization directions of the magnetization-pinned layer and the magnetization-free layer may be parallel to one surface of the tunnel barrier layer, but are not limited thereto. The magnetization directions of the magnetization-pinned layer and the magnetization-free layer may be perpendicular to one surface of the tunnel barrier layer. When the magnetization direction of the magnetization-free layer is parallel to that of the magnetization pinned layer, a memory device may have a first resistance value. When the magnetization direction of the magnetization-free layer is antiparallel to the magnetization direction of the magnetization pinned layer, a memory device may have a second resistance value. Data may be stored in the semiconductor device 1000 by using a difference in the resistance value of the memory device. The magnetization-pinned layer may have a magnetization direction fixed in one direction, and the magnetization direction of the magnetization-free layer may be changed by spin torque of internal electrons. The magnetization-pinned layer and the magnetization-free layer may include a magnetic material. The magnetization-pinned layer may further include an antiferromagnetic material for fixing a magnetization direction of a ferromagnetic material in the magnetization-pinned layer. The tunnel barrier layer may include at least one type of oxide selected from among magnesium (Mg), titanium (Ti), aluminum (Al), and zinc (Zn), but is not limited thereto.

From this, according to the implementations according to the disclosure, a switching device and a semiconductor device, in which a range of a decrease in a threshold voltage is reduced, may be provided.

A metal-doped switching device and a semiconductor device including the same have been described with reference to some example embodiments shown in the drawings, but these are merely examples, and it will be understood by those skilled in the art that various modifications and equivalents thereto can be made. The disclosed example embodiments should thus be considered in a descriptive sense only and not for purposes of limitation. The scope of the disclosure is defined not by the detailed description of the disclosure but by the appended claims, and all differences within the scope will be construed as being included in the disclosure.

In the switching device according to the disclosed example embodiments, an electrode layer is doped with a metal having a relatively great work function, and thus, a range of the decrease in a threshold voltage due to switching may be reduced.

According to the semiconductor device of the disclosed example embodiments, an electrode layer is doped with a metal having a relatively great work function, and thus a leakage current may be reduced to thereby improve the performance of the semiconductor device.

It should be understood that example embodiments described herein should be considered in a descriptive sense only and not for purposes of limitation. Descriptions of features or aspects within each example embodiment should typically be considered as available for other similar features or aspects in other example embodiments. While one or example more embodiments have been described with reference to the figures, it will be understood by those of ordinary skill in the art that various changes in form and details may be made therein without departing from the spirit and scope as defined by the following claims.

What is claimed is:

1. A switching device comprising:

a first electrode layer;

a second electrode layer arranged to face the first electrode layer; and a selection layer arranged between the first electrode layer and the second electrode layer, wherein the first electrode layer comprises titanium nitride (TiN), and the first electrode layer is doped with at least one of manganese (Mn), iron (Fe), niobium (Nb), molybdenum (Mo), technetium (Tc), ruthenium (Ru), rhodium (Rh), hafnium (Hf), tantalum (Ta), tungsten (W), rhenium (Re), iridium (Ir), or platinum (Pt).

2. The switching device of claim 1, wherein a doping concentration of the first electrode layer is equal to or less than about 15 at %.

3. The switching device of claim 1, wherein a doping concentration of the first electrode layer is greater than or equal to about 6 at % and equal to or less than about 15 at %.

4. The switching device of claim 1, wherein the selection layer comprises a chalcogenide material including germanium (Ge), arsenic (As), and selenium (Se).

5. The switching device of claim 4, wherein the chalcogenide material shows ovonic threshold switching material characteristics.

6. The switching device of claim 1, wherein the second electrode layer comprises titanium nitride (TiN).

7. A memory cell comprising:
a first electrode layer;
a second electrode layer arranged to face the first electrode layer;
a selection layer arranged between the first electrode layer and the second electrode layer;
a third electrode layer arranged to face the first electrode layer; and
a variable resistance layer arranged between the first electrode layer and the third electrode layer,
wherein the first electrode layer comprises titanium nitride (TiN), and
the first electrode layer is doped with at least one of manganese (Mn), iron (Fe), niobium (Nb), molybdenum (Mo), technetium (Tc), ruthenium (Ru), rhodium (Rh), hafnium (Hf), tantalum (Ta), tungsten (W), rhenium (Re), iridium (Ir), or platinum (Pt).

8. The memory cell of claim 7, wherein a doping concentration of the first electrode layer is equal to or less than about 15 at %.

9. The memory cell of claim 7, wherein a doping concentration of the first electrode layer is greater than or equal to about 6 at % and equal to or less than about 15 at %.

10. The memory cell of claim 7, wherein the selection layer comprises a chalcogenide material including germanium (Ge), arsenic (As), and selenium (Se).

11. The memory cell of claim 10, wherein the chalcogenide material shows ovonic threshold switching material characteristics.

12. The memory cell of claim 7, wherein the variable resistance layer comprises a phase change material.

13. A semiconductor device comprising:
a plurality of first electrode lines extending in a first direction and arranged apart from each other;
a plurality of second electrode lines extending in a second direction crossing the first direction and arranged apart from each other; and
a plurality of memory cells electrically connected between the first electrode lines and the second electrode lines at intersections between the first electrode lines and the second electrode lines, the plurality of memory cells each comprising a first electrode layer, a selection layer, a second electrode layer, and a variable resistance layer that are electrically connected to each other,
wherein the first electrode layer comprises titanium nitride (TiN), and
the first electrode layer is doped with at least one of manganese (Mn), iron (Fe), niobium (Nb), molybdenum (Mo), technetium (Tc), ruthenium (Ru), rhodium (Rh), hafnium (Hf), tantalum (Ta), tungsten (W), rhenium (Re), iridium (Ir), or platinum (Pt).

14. The semiconductor device of claim 13, wherein a doping concentration of the first electrode layer is equal to or less than about 15 at %.

15. The semiconductor device of claim 13, wherein a doping concentration of the first electrode layer is greater than or equal to about 6 at % and equal to or less than about 15 at %.

16. The semiconductor device of claim 13, further comprising:
a third electrode layer electrically connected to the variable resistance layer.

17. The semiconductor device of claim 13, wherein the semiconductor device has a three-dimensional cross point array structure.

18. The semiconductor device of claim 13, wherein the semiconductor device comprises phase-change random access memory (PRAM), resistive random access memory (RRAM), or magnetic random access memory (MRAM).

* * * * *